(12) United States Patent
Mercer et al.

(10) Patent No.: US 11,349,391 B1
(45) Date of Patent: *May 31, 2022

(54) ADAPTIVE ERROR AMPLIFIER CLAMPING IN A MULTI-FEEDBACK LOOP SYSTEM

(71) Applicant: Dialog Semiconductor (UK) Limited, London (GB)

(72) Inventors: Mark Mercer, Phoenix, AZ (US); Karthik Jayaraman, Chandler, AZ (US)

(73) Assignee: Dialog Semiconductor (UK) Limited, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/106,837

(22) Filed: Nov. 30, 2020

(51) Int. Cl.
*H02M 3/155* (2006.01)
*H02M 1/088* (2006.01)
*H03K 17/56* (2006.01)
*H02M 3/158* (2006.01)

(52) U.S. Cl.
CPC ........... *H02M 3/155* (2013.01); *H02M 1/088* (2013.01); *H02M 3/158* (2013.01); *H03K 17/56* (2013.01); *H03K 2217/0063* (2013.01); *H03K 2217/0072* (2013.01)

(58) Field of Classification Search
CPC ................. H02M 1/088; H02M 3/158; H02M 3/155–1588; H03K 17/56; H03K 2217/0063; H03K 2217/0072
See application file for complete search history.

(56) References Cited

U.S. PATENT DOCUMENTS

| 4,786,878 A | * | 11/1988 | Botti | H03F 3/187 330/124 R |
| 6,100,667 A | * | 8/2000 | Mercer | H02J 7/0069 320/137 |
| 6,104,170 A | * | 8/2000 | Lenk | H02J 7/00 320/163 |
| 7,518,348 B1 | | 4/2009 | Kobayashi | |
| 7,671,575 B1 | | 3/2010 | Suzuki | |

(Continued)

OTHER PUBLICATIONS

U.S. Notice of Allowance, U.S. Appl. No. 17/106,874, Applicant: Mercer et al., dated Nov. 23, 2021, 19 pages.

(Continued)

*Primary Examiner* — Yusef A Ahmed
(74) *Attorney, Agent, or Firm* — Saile Ackerman LLC; Stephen B. Ackerman (57) ABSTRACT

The present document relates to power converters with multiple feedback loops. The present document relates to a power converter with at least two feedback loops. The power converter may include a first error amplifier configured to generate a first error signal based on a first reference signal and a first feedback signal. The power converter may include a second error amplifier configured to generate a second error signal based on a second reference signal and a second feedback signal. The power converter may include a selector circuit configured to generate a selection signal by selecting the first error signal or the second error signal. The power converter may include a first clamp circuit configured to limit the first error signal to a first threshold value. The power converter may include a first threshold value generator circuit configured to generate the first threshold value dependent on the first error signal.

24 Claims, 8 Drawing Sheets

(56) References Cited

U.S. PATENT DOCUMENTS

| | | | |
|---|---|---|---|
| 7,706,155 B1* | 4/2010 | Bell | H02M 3/3376 |
| | | | 363/17 |
| 9,660,538 B2* | 5/2017 | Wu | H02M 3/33561 |
| 9,831,687 B2 | 11/2017 | Tsai et al. | |
| 9,831,697 B2* | 11/2017 | Kung | H02J 7/0063 |
| 9,831,768 B2 | 11/2017 | Lam | |
| 9,876,473 B2* | 1/2018 | Khesbak | H03F 1/0227 |
| 9,929,653 B1* | 3/2018 | Mercer | H02M 7/4837 |
| 10,090,763 B1* | 10/2018 | Mercer | H02M 3/158 |
| 10,180,695 B1* | 1/2019 | Bikulcius | G05F 1/468 |
| 10,554,124 B1* | 2/2020 | Mangudi | H02M 3/158 |
| 10,666,139 B1 | 5/2020 | Zhang | |
| 2005/0275388 A1 | 12/2005 | Takimoto et al. | |
| 2008/0238387 A1* | 10/2008 | Schmeller | H02M 3/156 |
| | | | 323/282 |
| 2009/0146634 A1* | 6/2009 | Audy | H02M 3/156 |
| | | | 323/290 |
| 2011/0095732 A1 | 4/2011 | Park et al. | |
| 2013/0207631 A1 | 8/2013 | Hirakawa | |
| 2016/0187902 A1* | 6/2016 | Zeng | G05F 1/575 |
| | | | 323/280 |
| 2017/0271987 A1* | 9/2017 | Yu | H02M 3/1582 |
| 2017/0358984 A1* | 12/2017 | Unno | H02M 3/158 |
| 2018/0004241 A1* | 1/2018 | Wang | H02M 1/08 |
| 2018/0337599 A1* | 11/2018 | Chen | H02M 3/158 |
| 2018/0351455 A1* | 12/2018 | Fan | H01F 41/04 |
| 2021/0044204 A1* | 2/2021 | Kesterson | H02M 3/07 |
| 2021/0226596 A1* | 7/2021 | Chen | H03F 3/45174 |
| 2021/0373586 A1* | 12/2021 | Takano | H05K 7/20209 |

OTHER PUBLICATIONS

German Office Action, File No. 10 2021 202 895.0, Applicant: Dialog Semiconductor (UK) Limited, dated Jul. 20, 2021, 5 pages.

German Office Action, File No. 10 2021 202 896.9, Applicant: Dialog Semiconductor (UK) Limited, dated Jul. 20, 2021, 5 pages.

Co-Pending U.S. Appl. No. 17/106,874, filed Nov. 30, 2020, "Preventing Inter-Loop Interference in a Multi-Feedback Loop System," by Mark Mercer et al., 31 pages.

"Li-Ion Battery Charger with Smooth-Switch-Over Four-Stage Control," by Yueming Sun et al., Proceedings of the 2009 12th International Symposium on Integrated Circuits, Dec. 14-16, 2009,pp. 49-52.

"Li-Ion Battery Charger with Three-Parameter Regulation Loop," by Elena E. Potanina et al., 2005 IEEE 36th Power Electronics Specialists Conference, Jun. 16, 2005, pp. 2836-2840.

"A Magnetically Coupled Feedback-Clamped Optimal Bidirectional Battery Charger," by R. K. Singh et al., IEEE Transactions on Industrial Electronics (vol. 60, Issue: 2, Feb. 2013), Feb. 3, 2012, pp. 422-432.

* cited by examiner

FIG. 8

ADAPTIVE ERROR AMPLIFIER CLAMPING IN A MULTI-FEEDBACK LOOP SYSTEM

RELATED PATENT APPLICATION

This application is related to U.S. patent application Ser. No. 17/106,837, filed on Nov. 30, 2020, which is owned by a common assignee, and which is herein incorporated by reference in its entirety.

TECHNICAL FIELD

The present document relates to power converters. In particular, the present document relates to power converter systems comprising two or more feedback loops.

BACKGROUND

Figure 1:
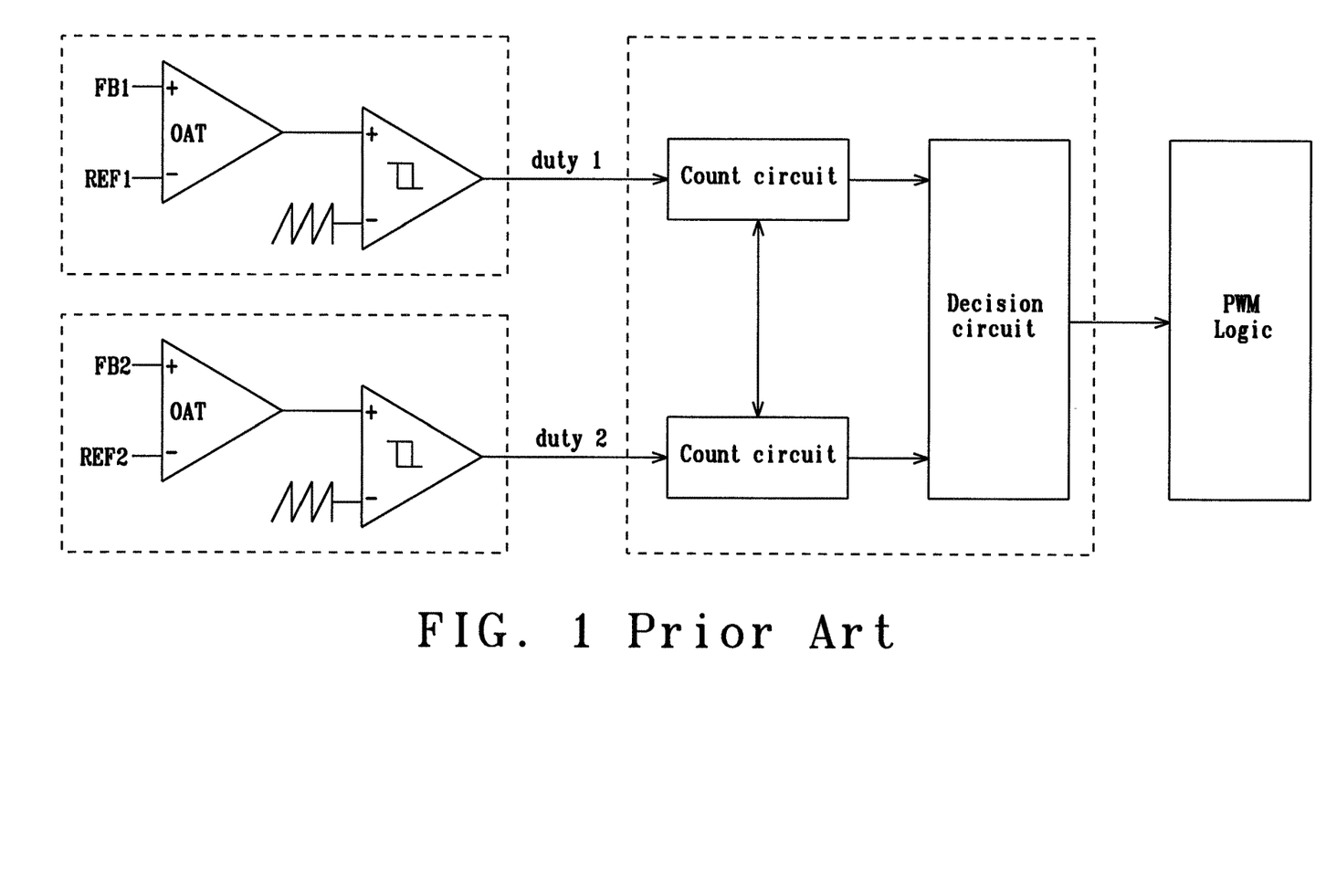
FIG. 1 shows an example of a power converter with two feedback loops.

Power converter systems are designed to maintain a well-regulated output, while maintaining high operating efficiencies. Further, output regulation is required to be maintained under a wide range of operating conditions, including but not limited to input voltage and output load conditions. FIG. 1 illustrates an example of a two feedback system where—depending on the operating conditions—one of the two feedback circuits is selected to provide an error signal to the pulse width modulation (PWM) logic.

Power converter systems utilizing multiple feedback loop circuits meet these stringent requirements, as each feedback loop is optimized for a particular operating condition. The operating condition is monitored, and the most suitable feedback loop is selected to provide the error signal to the modulation controller. For multi-feedback systems, there are a number of key factors to consider. Firstly, the most suitable feedback loop should be selected based on the current operating condition. Secondly, the system should adaptively transition from one feedback loop to another. And thirdly, the system should ensure that the transitions do not create adverse conditions, such as e.g. extreme under-shots or over-shots, or loop instability.

For changes in operating conditions that are relatively small in magnitude and slow in time, these factors do not present significant challenges. However, today's performance portable equipment requires low power consumption and high performance. This places an enormous burden on the power converter system as it is faced with dynamic load changes that are severe both from a magnitude and slew rate perspective.

SUMMARY

The present document addresses the above-mentioned technical problems. In particular, the present document addresses the technical problem of providing a multi-feedback loop power converter which minimizes the risk of a regulated parameter to deviate outside its specified accuracy limit when the system is exposed to rapid changes in operating conditions.

According to an aspect, a power converter is presented. The power converter may comprise a first error amplifier configured to generate a first error signal based on a first reference signal and a first feedback signal. The power converter may comprise a second error amplifier configured to generate a second error signal based on a second reference signal and a second feedback signal. The power converter may comprise a selector circuit configured to generate a selection signal by selecting the first error signal or the second error signal. The power converter may comprise a first clamp circuit configured to limit the first error signal to a first threshold value. The power converter may comprise a first threshold value generator circuit configured to generate the first threshold value dependent on the first error signal.

The first error amplifier may be configured to generate the first error signal based on a difference between the first reference signal and the first feedback signal. For example, the first reference signal may be applied to a non-inverting input of the first error amplifier, and the first feedback signal may be applied to an inverting input of the first error amplifier, or vice versa. Further, the first error amplifier may be configured to amplify said difference for generating the first error signal. The first error signal may be represented by a first error voltage or a first error current. The second error amplifier may be configured similarly or identically as the first error amplifier.

The power converter may comprise a first feedback circuit which comprises the first error amplifier. For instance, the first feedback circuit may be configured to derive the first feedback signal directly or indirectly from an output voltage or an output current of the power converter. Alternatively or additionally, the first feedback circuit may be configured to derive the first feedback signal directly or indirectly from an input voltage or an input current of the power converter.

The power converter may comprise a second feedback circuit which comprises the second error amplifier. For instance, the second feedback circuit may be configured to generate the second feedback signal, which may be different from the first feedback signal. Again, the second feedback signal may be derived from one or more of: the input voltage, the input current, the output voltage, and the output current of the power converter.

The described power converter may be used e.g. in a battery charging device. For example, the first feedback circuit may be configured to regulate a constant output voltage of the power converter during a constant voltage (CV) mode of operation. During the CV mode, the output current may be variable. The second feedback circuit may be configured to regulate a constant output current of the power converter during a constant current (CC) mode of operation. During the CC mode, the output voltage may be variable.

Moreover, the power converter may comprise a second clamp circuit configured to limit the second error signal to a second threshold value. Again, the power converter may comprise a second threshold value generator circuit configured to generate the second threshold value dependent on the second error signal (e.g. according to a linear dependency). In general, the power converter may comprise a plurality of feedback circuits, each comprising a respective error amplifier, a respective clamp circuit, and a respective threshold value generator circuit.

The first threshold value generator circuit may be configured to generate the first threshold value such that the first threshold value increases when the first error signal increases. For example, the first threshold value may be a first threshold voltage, and the first error signal may be a first error current which depends on a difference between a first feedback voltage (representing the first feedback signal) and a first reference voltage (representing the first reference signal). In other words, the first error amplifier may be a voltage controlled current source (VCCS) such as e.g. an operational transconductance amplifier (OTA). The first threshold value generator unit may then be configured to increase the first threshold voltage if the first error current increases, and to decrease the first threshold voltage if the first error current decreases.

The first threshold value generator circuit may be configured to generate the first threshold value such that the first threshold value is proportional to the first error signal.

As already mentioned in the foregoing description, the first error signal may be a first error current. The first threshold value generator circuit may comprise a current mirror configured to generate a mirror current based on the first error current. The first threshold value generator circuit may comprise a resistive element configured to translate said mirror current into the first threshold value. The current mirror may be e.g. based on CMOS technology or based on bipolar technology. For example, the current mirror may comprise a first mirror transistor configured to translate the first error current into a corresponding voltage, and a second mirror transistor configured to translate said corresponding voltage into the mirror current. The resistive element may be e.g. any sort of resistor, or a diode-connected transistor. The resistive element may be coupled between an output of the selector circuit and the first clamp circuit.

The power converter may further comprise an additional reference current source coupled to said resistive element. With the help of said additional reference current source, it becomes possible to add a constant offset voltage to the first threshold value which may be, in addition to said constant offset voltage, linearly dependent on the first error signal.

The current mirror may be connected to said resistive element such that the mirror current flows through said resistive element and generates a voltage difference between the output of the selector circuit and the first clamp circuit. The selector circuit may be configured to generate, at an output of the selector circuit, an output voltage representing the generated selection signal. In other words, said output voltage may be associated with the selected error signal, i.e. either the first or the second error signal. The voltage difference generated by the resistive element may then add to (or subtract from) said output voltage at the output of the selector circuit, and may serve as the first threshold value which is provided to the first clamp circuit. More specifically, as will be discussed in the following description, the resistive element may be coupled to an error amplifier of the first clamp circuit, and said error amplifier may clamp the first error signal based on the first threshold voltage provided by said resistive element.

The selector circuit may comprise a unity gain amplifier. The first error signal may be applied to a first non-inverting input of the unity gain amplifier. The second error signal may be applied to a second non-inverting input of the unity gain amplifier. An output signal of the unity gain amplifier may be feedback to an inverting input of the unity gain amplifier. It should be mentioned that the amplifier is unity gain only because of the direct connection of the output to the inverting input. The open loop gain of the amplifier may be much greater than unity.

The first clamp circuit may be an upper clamp circuit configured to limit the first error signal such that the first error signal does not exceed the first threshold voltage. At the same time, the first clamp circuit may be configured to neither limit nor influence the first error signal when the error signal is below the first threshold value.

The first clamp circuit may comprise a capacitive element configured to store a voltage indicative of the first error signal. The capacitive element may be e.g. a capacitor or another device capable of storing electrical energy in an electric field. The first clamp circuit may comprise a transistor coupled between the capacitive element and a reference potential. The first clamp circuit may comprise an error amplifier coupled to a control terminal of the transistor, and the error amplifier may be configured to compare the voltage indicative of the first error signal and the first threshold value.

Throughout this document, the term "reference potential" is meant in its broadest possible sense. In particular, the reference potential is not limited to ground i.e. a reference potential with a direct physical connection to earth. Moreover, the reference potential is not limited to a potential/voltage of 0V. Rather, the term "reference potential" may refer to any reference point to which and from which electrical currents may flow or from which voltages may be measured. Moreover, it should be mentioned that the reference potentials mentioned in this document may not necessarily refer to the same physical contact. Instead, the reference potentials mentioned in this document may relate to different physical contacts although reference is made to "the" reference potential for ease of presentation.

The error amplifier may be configured to generate an analog, continuous control signal for controlling the control terminal of the transistor based on an amplified difference between the voltage indicative of the first error signal and the first threshold voltage.

The selector circuit may be a minimum selector circuit configured to generate the selection signal by selecting the smaller one of the first error signal and the second error signal.

Alternatively, the selector circuit may be a maximum selector circuit configured to generate the selection signal by selecting the larger one of the first error signal and the second error signal. In this scenario, the first clamp circuit may be a lower clamp circuit configured to limit the first error signal such that the first error signal does not fall below the first threshold voltage. At the same time, the first clamp circuit may be configured to neither limit nor influence the first error signal when the error signal exceeds the first threshold value.

The power converter may further comprise a modulator circuit configured to generate, based on the selection signal, one or more control signals for controlling a power stage of the power converter. The power converter may further comprise a high-side switching element, a low-side switching element, and an inductor. The high-side switching element may be coupled to a switching node. The low-side switching element may be coupled between the switching node and a reference potential. The inductor may be coupled to the switching node.

The high-side switching element, the low-side switching element, and the inductor may form part of the power stage of the power converter. Depending on the type of the power converter, the switching elements and the inductor may be arranged in different ways. For example, the power converter may be a buck-type power converter configured to down-convert an input voltage of the power converter into a lower output voltage of the power converter. At the same time, an output current of the buck-type power converter may be larger than an input current of the buck-type power converter. In this scenario, the high-side switching element may be coupled between the input of the power converter and the switching node, and the inductor may be coupled between the switching node and the output of the power converter.

As another example, the power converter may be a boost-type power converter configured to up-convert the input voltage of the power converter to a larger output voltage of the power converter. In this case, the output current of the boost-type power converter may be smaller than the input current of the boost-type power converter. The inductor may be coupled between the input of the power converter and the switching node, and the high-side switching element may be coupled between the switching node and the output of the power converter. Of course, the power converter may be also a buck-boost power converter, or any other power converter with a related converter topology.

Each of the switching elements may be implemented with any suitable device, such as, for example, a metal-oxide-semiconductor field effect transistor (MOSFET), an insulated-gate bipolar transistor (IGBT), a MOS-gated thyristor, or any other suitable power device. Each switching element may have a control terminal to which a respective driving voltage or control signal may be applied to turn the switching element on (i.e. to close the switching element) or to turn the switching element off (i.e. to open the switching element).

According to another aspect, a method of operating a power converter is described. The method may comprise steps which correspond to the functional features of the power converter described in the present document. In particular, the power converter may comprise a first error amplifier, a second error amplifier, a selector circuit, a first clamp circuit, and a first threshold value generator circuit. The method may comprise generating, by the first error amplifier, a first error signal based on a first reference signal and a first feedback signal. The method may comprise generating, by the second error amplifier, a second error signal based on a second reference signal and a second feedback signal. The method may comprise generating, by the selector circuit, a selection signal by selecting the first error signal or the second error signal. The method may comprise limiting, by the first clamp circuit, the first error signal to a first threshold value. The method may comprise generating, by the first threshold value generator circuit, the first threshold value dependent on the first error signal.

The method may comprise generating, by the first threshold value generator circuit, the first threshold value such that the first threshold value increases when the first error signal increases. Specifically, the method may comprise generating, by the first threshold value generator circuit, the first threshold value such that the first threshold value is proportional to the first error signal.

The first error signal may be a first error current. The method may comprise generating, by a current mirror of the first threshold value generator circuit, a mirror current based on the first error current. The method may comprise translating, by a resistive element of the first threshold value generator circuit, said mirror current into the first threshold value. The method may comprise coupling the resistive element between an output of the selector circuit and the first clamp circuit. Optionally, the method may comprise coupling an additional reference current source to said resistive element.

The method may comprise connecting the current mirror to said resistive element such that the mirror current flows through said resistive element and generates a voltage difference between the output of the selector circuit and the first clamp circuit.

The selector circuit may comprise a unity gain amplifier. The method may comprise applying the first error signal to a first non-inverting input of the unity gain amplifier. The method may comprise applying the second error signal to a second non-inverting input of the unity gain amplifier. The method may comprise feedbacking an output signal of the unity gain amplifier to an inverting input of the unity gain amplifier.

The first clamp circuit may be an upper clamp circuit. The method may comprise limiting, by the upper clamp circuit, the first error signal such that the first error signal does not exceed the first threshold voltage. The method may comprise storing, by a capacitive element of the first clamp circuit, a voltage indicative of the first error signal. The method may comprise coupling a transistor of the first clamp circuit between the capacitive element and a reference potential. The method may comprise coupling an error amplifier of the first clamp circuit to a control terminal of the transistor. The method may comprise comparing, by the error amplifier, the voltage indicative of the first error signal and the first threshold value.

It should be mentioned that the capacitive element does not necessarily form part of the first clamp circuit. Rather, the described power converter may comprise a capacitive element, but may at the same time not comprise the first clamp circuit. In this regard, the skilled person readily understands that understands that a capacitive element may be required to translate an error current into an error voltage, which is in turn provided to the minimum selector amplifier 502.

The selector circuit may be a minimum selector circuit. The method may comprise generating, by the minimum selector circuit, the selection signal by selecting the smaller one of the first error signal and the second error signal.

Alternatively, the selector circuit may be a maximum selector circuit, and the first clamp circuit may be a lower clamp circuit. The method may comprise generating, by the maximum selector circuit, the selection signal by selecting the larger one of the first error signal and the second error signal. The method may comprise limiting, by the lower clamp circuit, the first error signal such that the first error signal does not fall below the first threshold voltage.

The method may comprise generating, by a modulator circuit, based on the selection signal, one or more control signals for controlling a power stage of the power converter. The power converter may further comprise a high-side switching element, a low-side switching element, and an inductor. The method may comprise coupling the high-side switching element to a switching node. The method may comprise coupling the low-side switching element between the switching node and a reference potential. The method may comprise coupling the inductor to the switching node.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DETAILED DESCRIPTION

Figure 2:
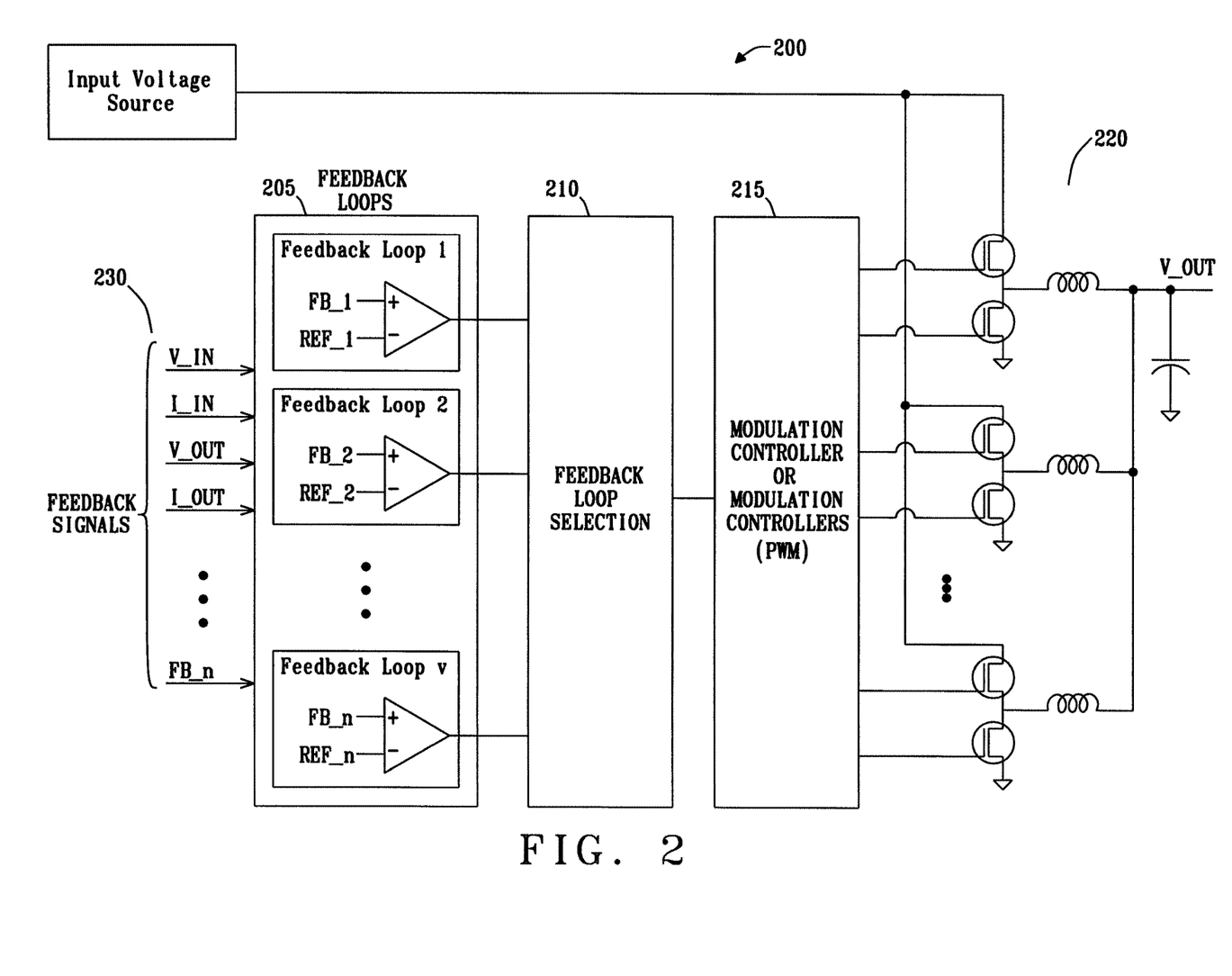
FIG. 2 shows an example of a power converter with a plurality of feedback loops.

FIG. 2 shows an example of a power converter 200 with a plurality of feedback loops 205, represented by feedback loops 1, 2, and n. The input to the feedback loops is a number of feedback signals 230. The outputs of the feedback loops 205 (i.e. the error signals) are input to the feedback loop selection block (selector circuit) 210. Once the appropriate feedback loop is determined, the feedback/error signal is input to the modulation controller(s) (modulator circuit) 215, which provide the control signals to the power stage(s) 220 in order to provide output regulation.

Figure 3:
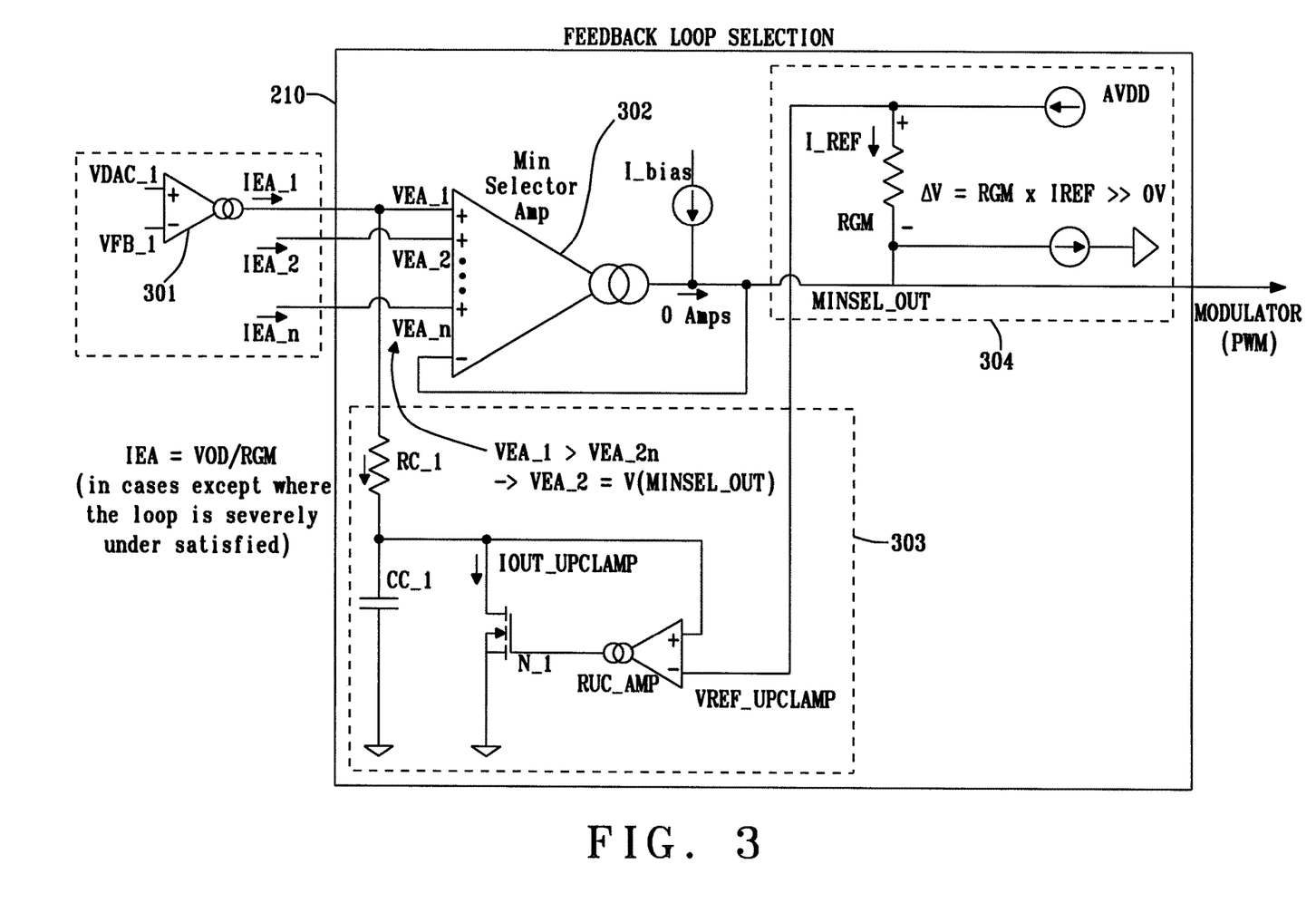
FIG. 3 shows an exemplary implementation of an error amplifier, a selector circuit, a clamp circuit, and a threshold generator circuit.

For the purposes of this invention, we will focus on the feedback loops and the feedback loop selection functions. FIG. 3 shows a detailed illustration of the feedback selection blocks 205 and 210 of FIG. 2. To be more specific, FIG. 3 shows an exemplary implementation of an error amplifier 301, a minimum selector circuit 302, a clamp circuit 303, and a threshold generator circuit 304. For the feedback signals that are not currently controlling the modulator controller 215, the regulation parameter, represented by FB_1, FB_2, FB_n, may be lower than the reference voltages VDAC_1, VDAC_2 and VDAC_n, respectively. All feedback loops may have a similar structure. When feedback loop 1 is not in control, the error amplifier 301 for feedback loop 1 may source current IEA_1 into the compensation network RC_1 and CC_1. The current IEA for the feedback loop whose control signal is currently being used to modulate the power stages (e.g. feedback loop 2) may be OA in steady state. For example, if the control signal from loop 2 was selected to be used to modulate the power stage, current IEA_2 may equal OA. Further, the output signal voltage of the error amplifier of feedback loop 2, VEA_2 as well as the voltage of the Min Selector Amplifier (MINSEL_OUT) may be less than the voltages VEA of all other feedback loops. As a consequence, the following equations hold: VEA_2<VEA_1, n and MINSEL_OUT<VEA_1, n. When VEA_Loop1≥MINSEL_OUT+RGM*IREF, the relative upper clamp (RUC) amplifier diverts current IEA_1 to prevent the capacitive element CC_1 from charging more than necessary. This operation may be repeated for all feedback loops that are not currently selected. In order to prevent the error signals from the feedback loops that are currently not selected to inadvertently interfere with the error signal of the feedback loop that is currently selected, the offset voltage IREF*RGM should be chosen substantially larger than 0V.

Although choosing a relatively large offset voltage IREF*RGM>>0 ensures that feedback signals from unselected feedback loops will not interfere with the selected control signal, it may have a significant disadvantage. When operating conditions change such that a transition from one feedback to another is required, IREF*RGM>>0 creates a long transition delay, as the voltage VEA of a newly desired feedback loop will need to fall below the voltage VEA of the currently active feedback loop in order to take over control.

Long transitions from one feedback loop to another create a delay of the power supply's ability to respond to sudden changes of the operating conditions. For example, let us assume that the output load was at a no-load or light load condition and was subjected to a significant dynamic load change to maximum load. It may be desirable to limit the input current overshoot, requiring a change in the "in-control" feedback loop. The delay in transitioning to the feedback loop optimized for regulating input current parameters may limit the ability to respond.

Figure 4:
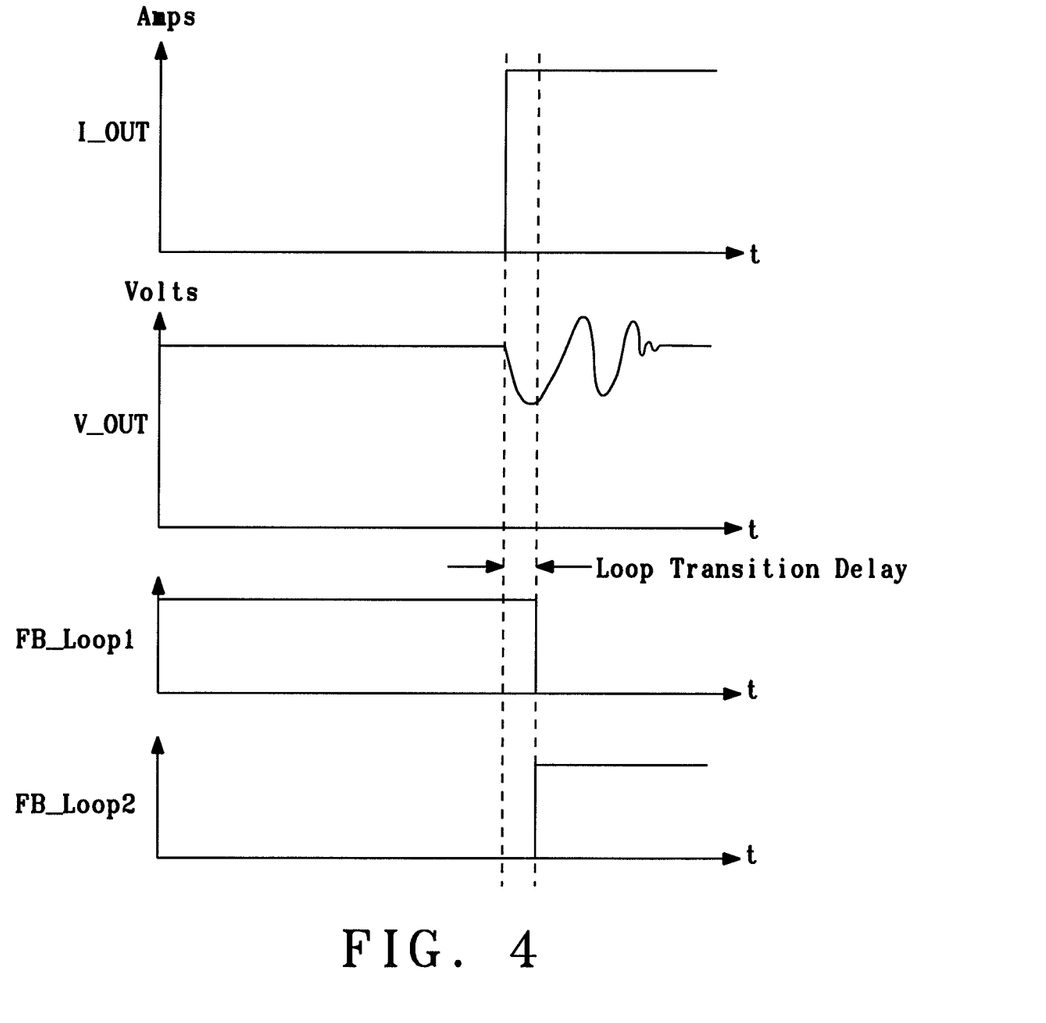
FIG. 4 shows a loop transition using the circuit elements of FIG. 3.

FIG. 4 shows the impact of a long delay in the feedback loop transition time due to the need for the VEA of the desired feedback loop to overcome the large IREF*RGM. In particular, FIG. 4 shows a loop transition using the circuit elements of FIG. 3.

In conclusion, multi-feedback loop power converter systems such as a battery charger can regulate one of several parameters as the operating conditions require. Further, assurances must be made to prevent the interference of control signals from non-selected feedback loops. In order to maintain a singular control signal, FIG. 3 shows the implementation of a fixed guard-band for unselected feedback loops. However, this guard-band introduces a delay during the transition from one feedback loop to another. These delays have a negative impact on output regulation, especially when there is a sharp change in the operating conditions.

What is needed in the art is a method for ensuring that multi-loop regulators expedite the transition of one control loop to another to reduce regulation transient errors.

The current invention describes a power converter system which preserves all of the benefits of prior art multi-feedback loop systems. It improves on prior art systems by minimizing the delay time of transitioning from one feedback loop to another. The reduction of the transition delay improves system performance, especially critical in high performance power supply systems. The transition delay is achieved while maintaining assurances that non-selected feedback loops would not interfere with the feedback signal of the selected feedback loop.

To reiterate a key concept, in order for a feedback loop to take control, the differential input overdrive voltage (VOD=VDAC−VFB) of that loop may be required to fall to 0V or below (i.e. transition from a positive value to 0V or less), and the voltage VEA signal must move down to the MINSEL_OUT level. For example, the VOD must fall far enough below 0V in order to generate a voltage change in the compensation network that can be as high as IREF*RGM. The more VOD falls below 0V (i.e. becomes more negative), the greater the feedback voltage VFB is above the regulation target of VDAC (which is an indication of an overshoot condition).

Figure 5:
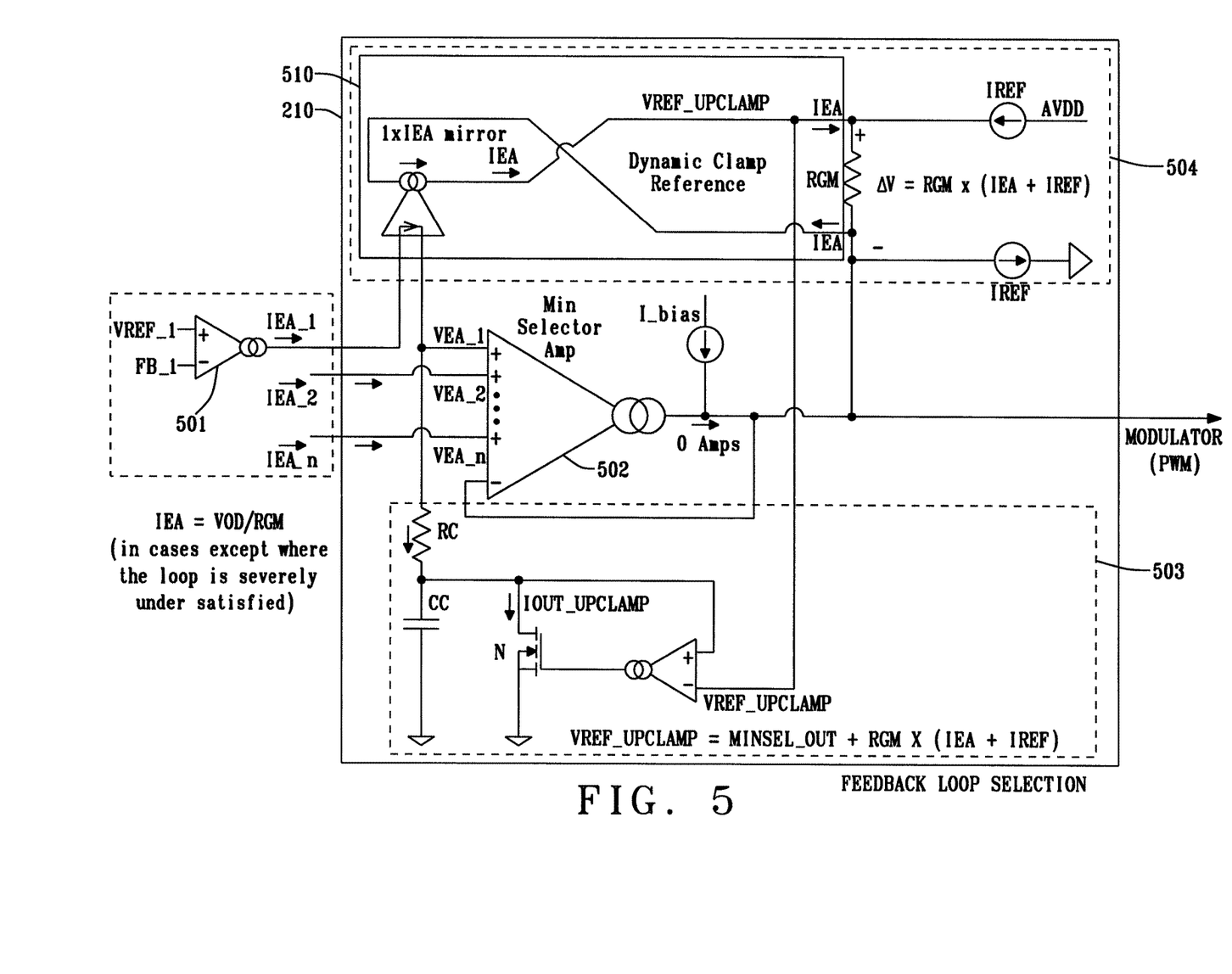
FIG. 5 shows another exemplary implementation of an error amplifier, a selector circuit, a clamp circuit, and a threshold generator circuit.

FIG. 5 shows another exemplary implementation according to the principles of the present invention. FIG. 5 shows an error amplifier 501, a minimum selector circuit 502, a clamp circuit 503, and a threshold generator circuit 504. The illustrated circuit minimizes the feedback loop transition time by minimizing ΔV, i.e. (IREF*RGM). Minimizing ΔV reduces the overshoot of feedback voltage VFB when a rapid change occurs such as a sudden change in the output load. Further, another critical feature is that the circuit in FIG. 5 ensures VREF_UPCLAMP is sufficiently large so that none of the not actively controlling VEA signals unintentionally interfere with the in-control VEA signal (due to ripple, transient noise coupling, offsets, etc.) during steady-state operation.

As shown in FIG. 5, the threshold generator circuit 504 may comprise a mirror block 510 which may comprise a suitable current mirror for dynamically controlling ΔV by utilizing a mirror current of the error amplifier's output current, IEA, thus proportionally setting VREF_UPCLAMP to be proportional to VOD=VDAC−VFB. As the voltage VOD increases, the not-in-control loop's VEA signal is allowed to rise higher relative to MINSEL_OUT. This lowers the risk of unintentional loop interaction due to noise coupling, signal ripple or other similar effects. Conversely, as the voltage VOD decreases, VREF_UPCLAMP decreases to allow for a faster loop transition. Since IEA supplements IREF, then IREF may be smaller than for the original relative clamp scheme discussed in the context of FIG. 3.

Figure 6:
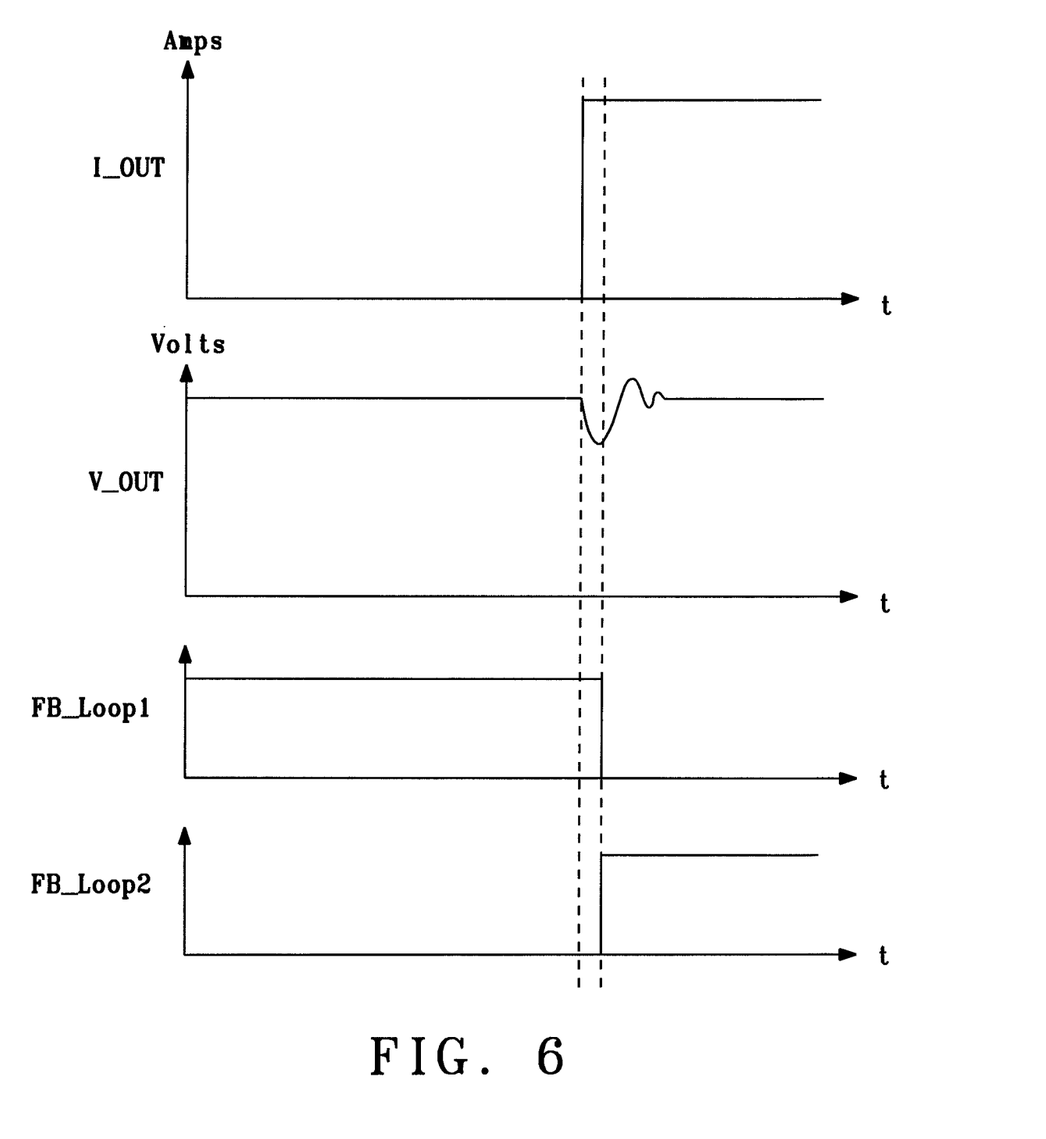
FIG. 6 shows a loop transition using the circuit elements of FIG. 5.

FIG. 6 shows a loop transition using the circuit elements of FIG. 5. That is, FIG. 6 shows the improved performance resulting from the minimized feedback loop transition delay.

Figure 7:
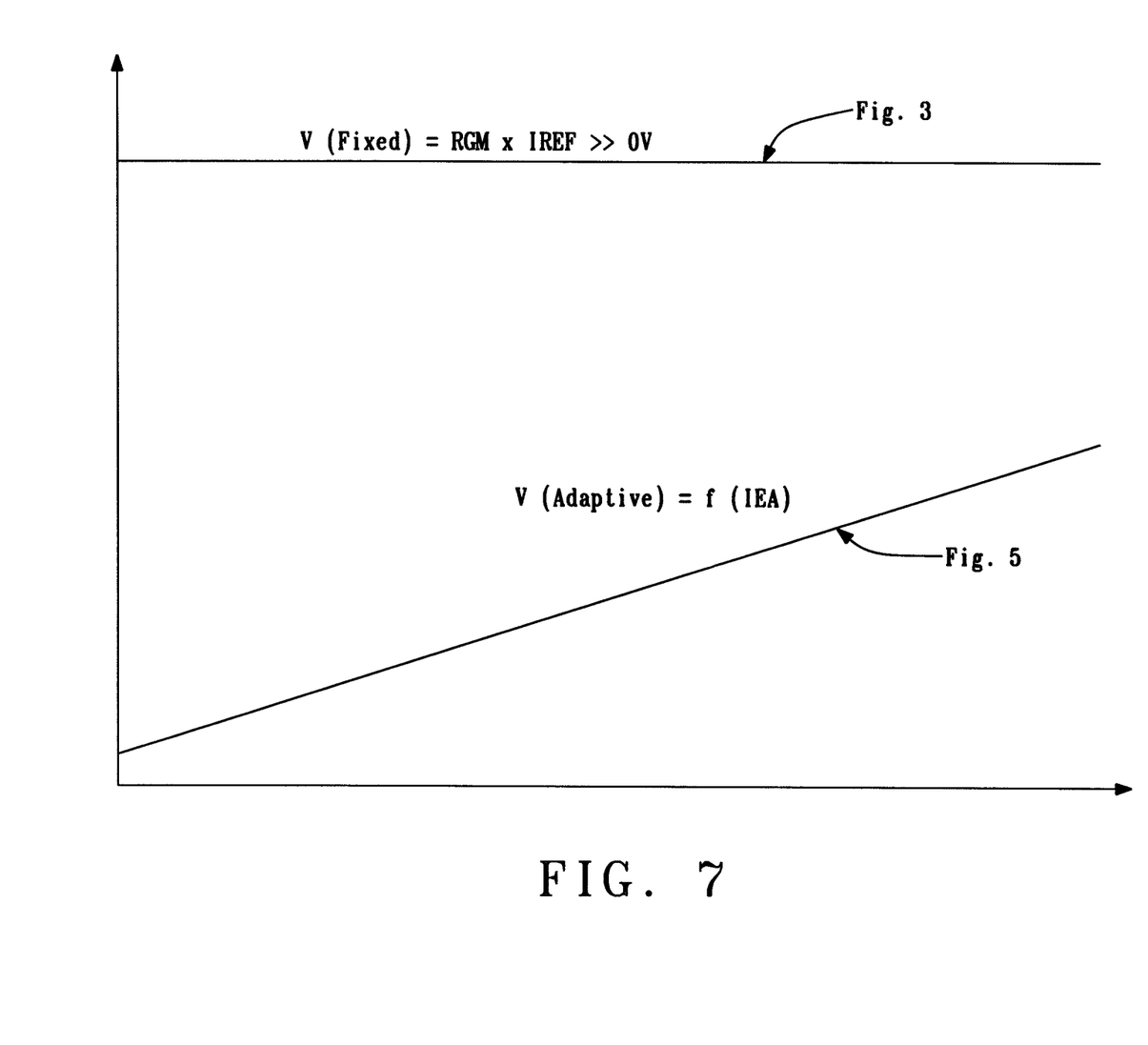
FIG. 7 shows the relation between the generated threshold voltages and the error currents.

As a non-limiting embodiment was illustrated in FIG. 5, the diagram in FIG. 7 illustrates the generalized idea of the invention. The feedback loop transition delay and the assurance of non-interference by non-selected feedback loops are achieved by setting the ΔV of each feedback loop proportionally to the current IEA of that feedback loop.

Figure 8:
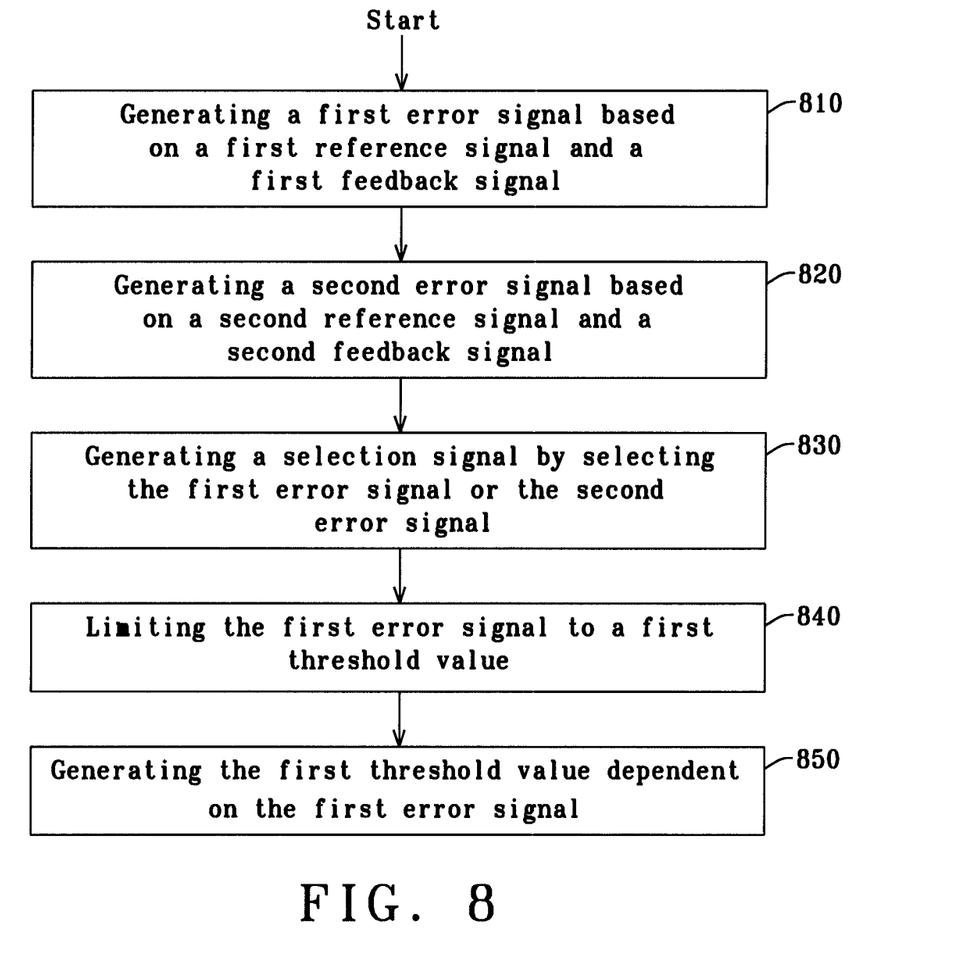
FIG. 8 shows a flowchart of a method for adaptive error amplifier clamping in a multi-feedback loop system.

FIG. 8 shows a flowchart of a method for adaptive error amplifier clamping in a multi-feedback loop system. The method may comprise step 810, generating, by the first error amplifier, a first error signal based on a first reference signal and a first feedback signal. The method may also comprise step 820, generating, by the second error amplifier, a second error signal based on a second reference signal and a second feedback signal. The method may comprise step 830, generating, by the selector circuit, a selection signal by selecting the first error signal or the second error signal. The method may also comprise step 840, limiting, by the first clamp circuit, the first error signal to a first threshold value. The method may comprise step 850, generating, by the first threshold value generator circuit, the first threshold value dependent on the first error signal.

In conclusion, it is a main objective of the present invention to expedite the transfer of control of a multiple-loop regulator from one regulation loop to another. Thus, it may be regarded as a primary objective to minimize the risk of the regulated parameter to deviate outside its specified accuracy limits (e.g., minimize current or voltage over/undershoot) when the system is exposed to a rapid change in the operating conditions (e.g., load step/release or input voltage change).

Thus, a power converter in accordance with the principles of the present may comprise a regulator with multiple control parameter options where only one parameter is controlled at a time. The power converter may comprise a means to determine which parameter is to be controlled in conjunction with various operating conditions. The power converter may comprise a clamp circuit for restricting the range of the output of signal produced by the error amplifier associated with each regulation parameter. The power converter may comprise a dynamic or adaptive reference signal for the clamp circuit. The power converter may comprise a means to control the dynamic reference such that the dynamic reference signal is proportional to the differential input signal of error amplifier with which the clamp circuit interacts.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A power converter comprising
   a first error amplifier configured to generate a first error signal based on a first reference signal and a first feedback signal,
   a second error amplifier configured to generate a second error signal based on a second reference signal and a second feedback signal,
   a selector circuit configured to generate a selection signal by selecting the first error signal or the second error signal,
   a first clamp circuit configured to limit the first error signal to a first threshold value, and
   a first threshold value generator circuit configured to generate the first threshold value dependent on the first error signal,
   wherein the selector circuit is a maximum selector circuit configured to generate the selection signal by selecting the larger one of the first error signal and the second error signal, and
   wherein the first clamp circuit is a lower clamp circuit configured to limit the first error signal such that the first error signal does not fall below the first threshold voltage.

2. The power converter according to claim 1, wherein the first threshold value generator circuit is configured to generate the first threshold value such that the first threshold value increases when the first error signal increases.

3. The power converter according to claim 1, further comprising
   a modulator circuit configured to generate, based on the selection signal, one or more control signals for controlling a power stage of the power converter.

4. The power converter according to claim 1, further comprising a high-side switching element, a low-side switching element, and an inductor, wherein
   the high-side switching element is coupled to a switching node,
   the low-side switching element is coupled between the switching node and a reference potential, and
   the inductor is coupled to the switching node.

5. A method of operating a power converter, wherein the method comprises
   generating a first error signal based on a first reference signal and a first feedback signal,
   generating a second error signal based on a second reference signal and a second feedback signal,
   generating a selection signal by selecting the first error signal or the second error signal,
   limiting the first error signal to a first threshold value, and
   generating the first threshold value dependent on the first error signal,
   wherein a selector circuit is a maximum selector circuit, wherein a first clamp circuit is a lower clamp circuit, and wherein the method comprises generating, by the maximum selector circuit, the selection signal by selecting the larger one of the first error signal and the second error signal, and limiting, by the lower clamp circuit, the first error signal such that the first error signal does not fall below the first threshold voltage.

6. The method according to claim 5, comprising generating the first threshold value such that the first threshold value increases when the first error signal increases.

7. The method according to claim 5, further comprising generating, based on the selection signal, one or more control signals for controlling a power stage of the power converter.

8. The method according to claim 5, wherein the power converter further comprises a high-side switching element, a low-side switching element, and an inductor, and wherein the method comprises coupling the high-side switching element to a switching node, coupling the low-side switching element between the switching node and a reference potential, and coupling the inductor to the switching node.

9. A power converter comprising a first error amplifier configured to generate a first error signal based on a first reference signal and a first feedback signal, a second error amplifier configured to generate a second error signal based on a second reference signal and a second feedback signal, a selector circuit configured to generate a selection signal by selecting the first error signal or the second error signal, a first clamp circuit configured to limit the first error signal to a first threshold value, and a first threshold value generator circuit configured to generate the first threshold value dependent on the first error signal, wherein the first error signal is a first error current, and wherein the first threshold value generator circuit comprises a current mirror configured to generate a mirror current based on the first error current, and a resistive element configured to translate said mirror current into the first threshold value.

10. The power converter according to claim 9, wherein the resistive element is coupled between an output of the selector circuit and the first clamp circuit.

11. The power converter according to claim 9, further comprising an additional reference current source coupled to said resistive element.

12. The power converter according to claim 9, wherein the current mirror is connected to said resistive element such that the mirror current flows through said resistive element and generates a voltage difference between the output of the selector circuit and the first clamp circuit.

13. The power converter according to claim 9, wherein the first clamp circuit is an upper clamp circuit configured to limit the first error signal such that the first error signal does not exceed the first threshold voltage.

14. The power converter according to claim 9, wherein the selector circuit is a minimum selector circuit configured to generate the selection signal by selecting the smaller one of the first error signal and the second error signal.

15. A power converter comprising a first error amplifier configured to generate a first error signal based on a first reference signal and a first feedback signal, a second error amplifier configured to generate a second error signal based on a second reference signal and a second feedback signal, a selector circuit configured to generate a selection signal by selecting the first error signal or the second error signal, a first clamp circuit configured to limit the first error signal to a first threshold value, and a first threshold value generator circuit configured to generate the first threshold value dependent on the first error signal, wherein the first threshold value generator circuit is configured to generate the first threshold value such that the first threshold value is proportional to the first error signal, wherein the selector circuit comprises a unity gain amplifier, and wherein the first error signal is applied to a first non-inverting input of the unity gain amplifier, the second error signal is applied to a second non-inverting input of the unity gain amplifier, and an output signal of the unity gain amplifier is feedback to an inverting input of the unity gain amplifier.

16. A power converter comprising a first error amplifier configured to generate a first error signal based on a first reference signal and a first feedback signal, a second error amplifier configured to generate a second error signal based on a second reference signal and a second feedback signal, a selector circuit configured to generate a selection signal by selecting the first error signal or the second error signal, a first clamp circuit configured to limit the first error signal to a first threshold value, and a first threshold value generator circuit configured to generate the first threshold value dependent on the first error signal, wherein the first threshold value generator circuit is configured to generate the first threshold value such that the first threshold value is proportional to the first error signal, and wherein the first clamp circuit comprises a capacitive element configured to store a voltage indicative of the first error signal, a transistor coupled between the capacitive element and a reference potential, and an error amplifier coupled to a control terminal of the transistor, wherein the error amplifier is configured to compare the voltage indicative of the first error signal and the first threshold value.

17. A method of operating a power converter, wherein the method comprises generating a first error signal based on a first reference signal and a first feedback signal, generating a second error signal based on a second reference signal and a second feedback signal, generating a selection signal by selecting the first error signal or the second error signal, limiting the first error signal to a first threshold value, and generating the first threshold value dependent on the first error signal, wherein the first error signal is a first error current, and wherein the method further comprises generating a mirror current based on the first error current, and translating, by a resistive element, said mirror current into the first threshold value.

18. The method according to claim 17, comprising coupling the resistive element between an output of a selector circuit and a first clamp circuit.

19. The method according to claim 17, further comprising coupling an additional reference current source to said resistive element.

20. The method according to claim 17, comprising connecting a current mirror to said resistive element such that the mirror current flows through said resistive element and generates a voltage difference between the output of the selector circuit and the first clamp circuit.

21. The method according to claim 17, wherein a first clamp circuit is an upper clamp circuit, and wherein the method comprises limiting, by the upper clamp circuit, the first error signal such that the first error signal does not exceed the first threshold voltage.

22. The method according to claim 17, wherein a selector circuit is a minimum selector circuit, and wherein the method comprises generating, by the minimum selector circuit, the selection signal by selecting the smaller one of the first error signal and the second error signal.

23. A method of operating a power converter, wherein the method comprises generating a first error signal based on a first reference signal and a first feedback signal, generating a second error signal based on a second reference signal and a second feedback signal, generating a selection signal by selecting the first error signal or the second error signal, limiting the first error signal to a first threshold value, generating the first threshold value dependent on the first error signal, and generating the first threshold value such that the first threshold value is proportional to the first error signal, wherein a selector circuit comprises a unity gain amplifier, and wherein the method further comprises applying the first error signal to a first non-inverting input of the unity gain amplifier, applying the second error signal to a second non-inverting input of the unity gain amplifier, and feeding back an output signal of the unity gain amplifier to an inverting input of the unity gain amplifier.

24. A method of operating a power converter, wherein the method comprises generating a first error signal based on a first reference signal and a first feedback signal, generating a second error signal based on a second reference signal and a second feedback signal, generating a selection signal by selecting the first error signal or the second error signal, limiting the first error signal to a first threshold value, generating the first threshold value dependent on the first error signal, generating the first threshold value such that the first threshold value is proportional to the first error signal, storing, by a capacitive element, a voltage indicative of the first error signal, coupling a transistor between the capacitive element and a reference potential, coupling an error amplifier to a control terminal of the transistor, and comparing the voltage indicative of the first error signal and the first threshold value.

\* \* \* \* \*

UNITED STATES PATENT AND TRADEMARK OFFICE
CERTIFICATE OF CORRECTION

| | |
|---|---|
| PATENT NO. | : 11,349,391 B1 |
| APPLICATION NO. | : 17/106837 |
| DATED | : May 31, 2022 |
| INVENTOR(S) | : Mark Mercer and Karthik Jayaraman |

It is certified that error appears in the above-identified patent and that said Letters Patent is hereby corrected as shown below:

In the Specification

In Column 1, Line 7, delete Ser. No. "17/106,837" and replace with -- 17/106,874 --.

Signed and Sealed this
Twenty-first Day of March, 2023

*Katherine Kelly Vidal*

Katherine Kelly Vidal
*Director of the United States Patent and Trademark Office*